(12) United States Patent
Yamagami et al.

(10) Patent No.: US 8,783,319 B2
(45) Date of Patent: Jul. 22, 2014

(54) FOREIGN SUBSTANCE REMOVING DEVICE AND DIE BONDER EQUIPPED WITH THE SAME

(75) Inventors: Takashi Yamagami, Kumagaya (JP); Ryuichi Takano, Kumagaya (JP); Hiroshi Maki, Kumagaya (JP); Masayuki Mochizuki, Kumagaya (JP)

(73) Assignee: Hitachi High-Tech Instruments Co., Ltd., Kumagaya-shi (JP)

( * ) Notice: Subject to any disclaimer, the term of this patent is extended or adjusted under 35 U.S.C. 154(b) by 99 days.

(21) Appl. No.: 13/224,536

(22) Filed: Sep. 2, 2011

(65) Prior Publication Data
US 2012/0241096 A1    Sep. 27, 2012

(30) Foreign Application Priority Data
Mar. 23, 2011  (JP) ................. 2011-063592

(51) Int. Cl.
*B32B 38/10* (2006.01)
(52) U.S. Cl.
USPC ............................. 156/535; 134/133; 134/191
(58) Field of Classification Search
USPC .......... 156/556, 538, 580, 535; 134/198, 191, 134/56 R, 58 R, 18
See application file for complete search history.

(56) References Cited

U.S. PATENT DOCUMENTS

| | | | |
|---|---|---|---|
| 6,049,656 A | 4/2000 | Kim et al. | |
| 2006/0166466 A1 * | 7/2006 | Maki et al. | 438/464 |
| 2010/0229902 A1 * | 9/2010 | Kanzaki et al. | 134/56 R |
| 2011/0155193 A1 * | 6/2011 | Nanba et al. | 134/56 R |

FOREIGN PATENT DOCUMENTS

| | | | | |
|---|---|---|---|---|
| JP | 6-37121 A | | 2/1994 | |
| JP | 2000-005715 | * | 1/2000 | ............... B08B 5/00 |
| JP | 2001-94298 A | | 4/2001 | |
| JP | 2002-050655 | * | 2/2002 | ............. H01L 21/60 |
| JP | 2007-29798 A | | 2/2007 | |
| JP | 2008-53531 A | | 3/2008 | |
| JP | 2009-135302 A | | 6/2009 | |
| TW | 201034100 A1 | | 9/2010 | |

OTHER PUBLICATIONS

Korean-language Office Action dated Mar. 22, 2013 (Four (4) pages).
Taiwanese Office Action dated Sep. 23, 2013 (Eight (8) pages).

* cited by examiner

*Primary Examiner* — Katarzyna Wyrozebski Lee
*Assistant Examiner* — Vishal I Patel
(74) *Attorney, Agent, or Firm* — Crowell & Moring LLP (57) ABSTRACT

The invention has an object to provide a foreign substance removing device that is capable of quickly and efficiently cleaning substrate surfaces regardless of the size thereof and preventing readhesion of once removed foreign substances as well as to provide a die bonder equipped with the same.

The foreign substance removing device of the invention includes: a pickup device to which a dicing film carrying dies thereon is fixed; and a collet for picking up a die separated from the dicing film and placing the die on a substrate having an adhesive applied thereon, and operates to remove foreign substances on the substrate in preparation for application of the adhesive onto the substrate. The foreign substance removing device includes a cleaning nozzle integrating an air outlet orifice and an air inlet orifice.

4 Claims, 6 Drawing Sheets

FOREIGN SUBSTANCE REMOVING DEVICE AND DIE BONDER EQUIPPED WITH THE SAME

BACKGROUND OF THE INVENTION

1. Field of the Invention

The present invention relates to a foreign substance removing device and a die bonder equipped with the same.

2. Description of the Related Art

The die bonder is an apparatus which bonds a die (silicon wafer chip integrating electric circuits) to a lead frame, substrate or the like (hereinafter, referred to as "substrate") using solder, gold plate or resin as a bonding material. An engineering plastic is used as a die bond material (paste, film) for bonding the die and the substrate together. After positioning, the die is bonded to the lead frame or the like. A method of implementing bonding by using a resin as the bonding material is now predominant.

In semiconductor die bonding, solder or resin paste for die bonding (Ag epoxy and Ag polyimide) is used as an adhesive for fixing a semiconductor chip (IC, LSI) to the lead frame, ceramic case, substrate or the like.

Dusts on a substrate surface lower the bonding force of an adhesive. It is therefore quite important in die mounting to remove the dusts (hereinafter, referred to as "foreign substances") from the substrate before bonding the die onto the substrate. In addition, foreign particles of sizes in the range of 5 to 10 μm also cause voids in the adhesive.

Accordingly, a common practice in a die bonding operation is to perform cleaning with air flow. Such cleaning techniques known in the art are set forth in the following patent documents.

JP-A No. 2002-50655, for example, discloses an arrangement wherein plural types of cleaning devices are arranged along a transport path for horizontally transporting the substrate so that the substrate being transported is subjected to cleaning before chips are mounted thereon.

JP-A No. 2002-186923 discloses an arrangement wherein the foreign substances adhered to the substrate surface is vacuumed off by a dust collector.

JP-A No. 2000-5715 discloses an apparatus wherein a dust removing device integrating an air outlet chamber and an air inlet chamber is disposed in a moving direction of a work piece.

JP-A No. 2007-115979 discloses an arrangement wherein the foreign substances adhered to a surface of a wafer ring carrying a chip array thereon are removed by blasting an ionized gas followed by sucking.

As described in the above patent documents, the removal of the foreign substances on the substrate surface is generally accomplished by a method wherein the foreign substances are blown off by applying an air flow and the blown foreign substances are collected by air suction. Unfortunately, however, all these patent documents adopt a stationary system of foreign substance removal, which comes short of ensuring an efficient foreign-substance removal across the full width of substrate and preventing the readhesion of once removed foreign substances.

SUMMARY OF THE INVENTION

It is an object of the invention to provide a foreign substance removing device that is adapted for quick and efficient cleaning of the substrate surface regardless of the size thereof and for prevention of readhesion of once removed foreign substances, as well as a die bonder equipped with the same.

According to a first aspect of the invention for achieving the above object, a foreign substance removing device comprises: a pickup device to which a dicing film carrying dies thereon is fixed; a collet for picking up a die separated from the dicing film and placing the die on a substrate having an adhesive applied thereon; and a cleaning nozzle integrating an air outlet orifice and an air inlet orifice and applying air flow for removal of foreign substances on the substrate before the die is bonded onto the substrate.

According to the first aspect and another aspect of the invention for achieving the above object, it is preferred that the cleaning nozzle includes a plurality of air outlet orifices formed in an elliptical form and a plurality of air inlet orifices formed in an elliptical arrangement to surround the air outlet orifices.

According to the first aspect and another aspect of the invention for achieving the above object, it is preferred that the cleaning nozzle is elongated in a moving direction of the substrate and moved in a direction perpendicular to the moving direction of the substrate.

According to the first aspect and another aspect of the invention for achieving the above object, it is preferred that the cleaning nozzle is elongated in a direction perpendicular to a moving direction of the substrate and moved in the direction perpendicular to the moving direction of the substrate and that the two cleaning nozzles are provided.

According to the first aspect and another aspect of the invention for achieving the above object, it is preferred that the cleaning nozzles are arranged in a staggered form.

According to the first aspect and another aspect of the invention for achieving the above object, it is preferred that the cleaning nozzle rotates about a longitudinal end thereof in a direction perpendicular to a moving direction of the substrate.

According to the first aspect and another aspect of the invention for achieving the above object, it is preferred that the plural cleaning nozzles are arranged in a direction perpendicular to a moving direction of the substrate.

According to the first aspect and another aspect of the invention for achieving the above object, it is preferred that the cleaning nozzle periodically performs air blasting and air sucking.

The invention can provide a die bonder and a foreign substance removing device that are adapted for quick and efficient cleaning of the substrate surface regardless of the size thereof and for prevention of readhesion of once removed foreign substances.

DETAILED DESCRIPTION OF THE PREFERRED EMBODIMENTS

A nozzle which ejects air for removal of foreign substances on the substrate may have a configuration wherein a circular air outlet orifice is formed at the center and is surrounded by an air inlet orifice in the form of a ring.

Such a nozzle can suck in dust particles at once before the dust particles are stirred up by the air flow. It is therefore ensured that the once removed dust particles are prevented from adhering again onto the substrate.

On the other hand, the substrate to receive the die does not always have a constant width. Since the die bonder bonds dies to substrates of different widths, the cleaning operation need to deal with the substrates having various widths.

Therefore in a case where the cleaning nozzle has the circular air outlet orifice and the ring-like air inlet orifice, as described above, the nozzle must move over a longer distance to clean the substrate having a maximum width. This results in increased cleaning time.

After various studies on the configuration and operation mode of the cleaning nozzle that can deal with the various substrate widths, the present inventors have accomplished the following embodiments.

Figure 1:
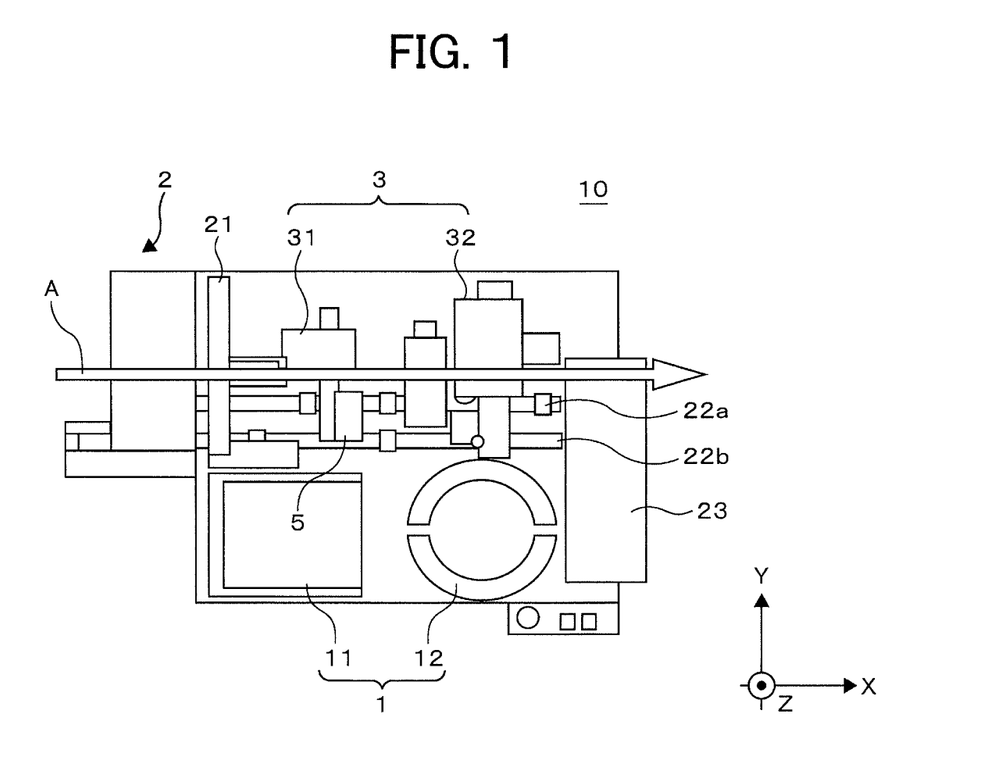
FIG. 1 is a conceptual diagram of a die bonder as seen from above.
Figure 2:
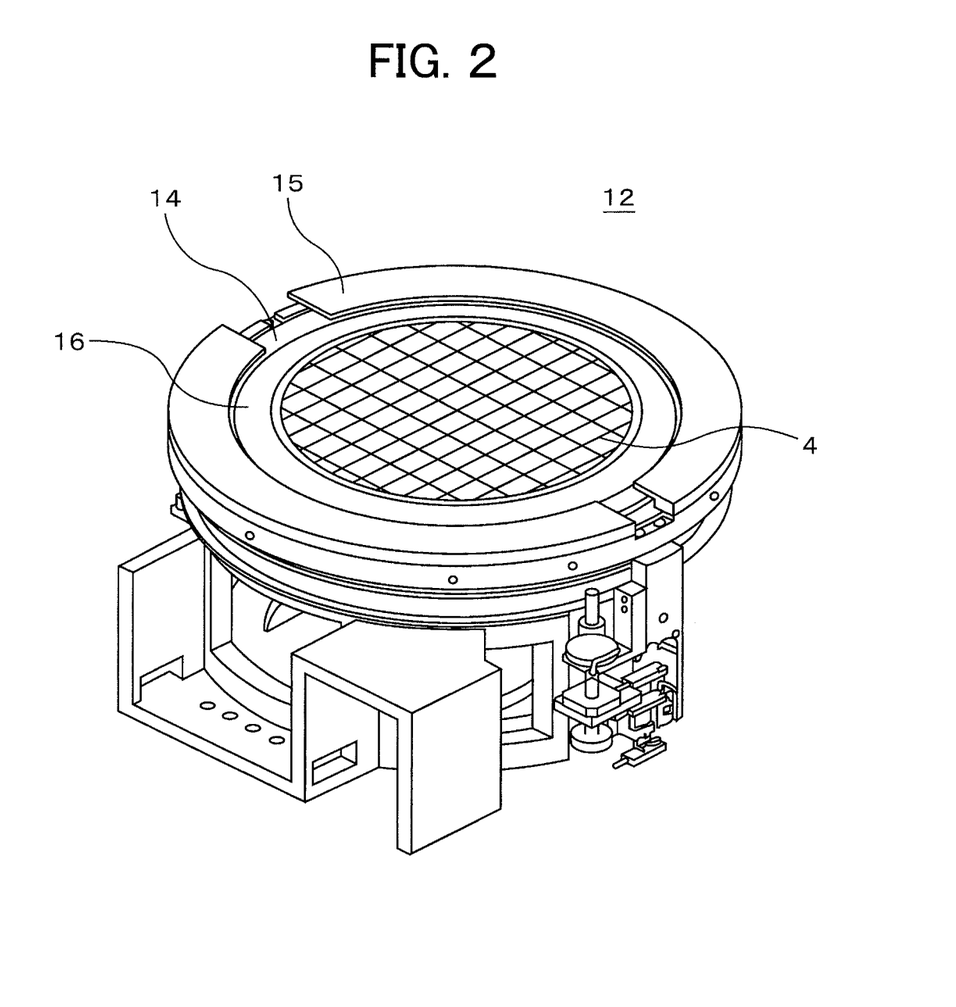
FIG. 2 is an external perspective view showing a pickup device mounted in the die bonder of FIG. 1.

Referring to FIG. 1 and FIG. 2, an embodiment of a die bonder is described as below.

FIG. 1 is a conceptual diagram of the die bonder as seen from above.

Referring to FIG. 1, the die bonder principally includes a wafer feeder 1, a work-piece feeding/transporting portion 2 and a die bonding portion 3. The wafer feeder 1 includes a wafer cassette lifter 11 and a pickup device 12. The wafer cassette lifter 11 includes a wafer cassette loaded with wafer rings (not shown) for sequentially feeding the wafer rings to the pickup device 12. The pickup device 12 is adapted to move the wafer ring for picking up a desired die from the wafer ring.

The work-piece feeding/transporting portion 2 includes a stack loader 21, a frame feeder (not shown) and an unloader 23. The stack loader 21 transports a substrate (not shown) to receive a die in a direction of an arrow A in the figure by means of substrate guides 22a, 22b. The substrate guides 22a, 22b transports the substrate to the unloader 23 via two processing positions on the frame feeder 22. The unloader 23 defines a portion to store the delivered substrates. A cleaning nozzle (foreign substance removing device) 5 is installed at place above the substrate guides 22a, 22b and the substrate transported. The die bonding portion 3 includes a preform portion (die paste applicator) 31 and a bonding head portion 32.

FIG. 2 is an external perspective view showing the pickup device mounted in the die bonder.

Referring to FIG. 2, the pickup device 12 includes: an expand ring 15 for retaining a wafer ring 14, and a support ring (not shown) for horizontally positioning a dicing tape 16 retained by the wafer ring 14 and having a plurality of dies (chips) 4 adherent thereto. A plurality of formed dies 4 are extracted one by one by means of the preform portion 31 and bonded to a surface of the substrate with an adhesive applied thereto, the substrate transported by means of the substrate guides 22a, 22b shown in FIG. 1.

A detailed description is made as below on the cleaning nozzle 5 of the invention.

First Embodiment

Figure 3:
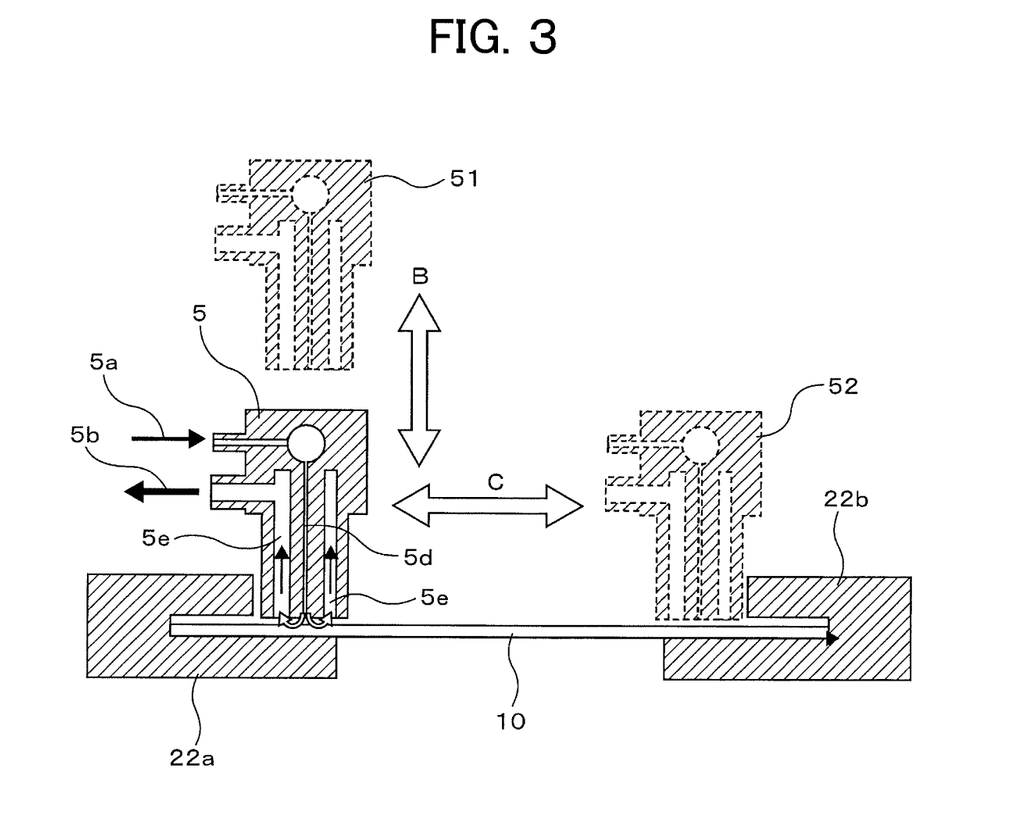
FIG. 3 is a schematic diagram showing a structure of a cleaning nozzle according to a first embodiment of the invention.

FIG. 3 is a schematic diagram showing a structure of a cleaning nozzle according to a first embodiment of the invention.

Figure 4:
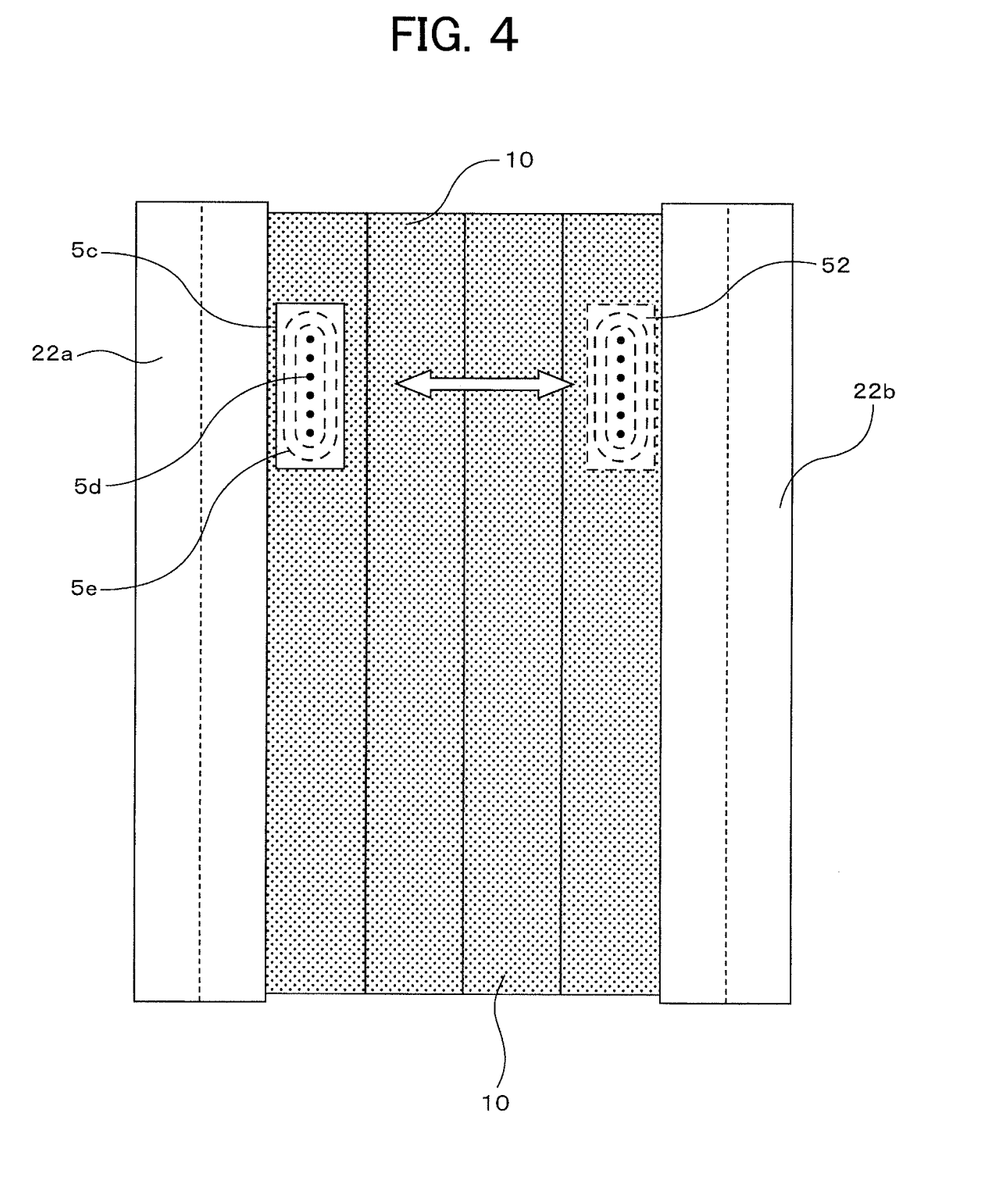
FIG. 4 is a diagram showing movement and configuration of an air nozzle of the cleaning nozzle according to the first embodiment.

FIG. 4 is a diagram showing movement and configuration of a cleaning nozzle of the cleaning nozzle according to the first embodiment.

Referring to FIG. 3 and FIG. 4, a substrate 10 supported in grooves of the substrate guides 22a, 22b is transported in a backward direction as seen on the drawing surface (shown in FIG. 3). The cleaning nozzle 5 is provided with an air feed pipe 5a and an air discharge pipe 5b. As shown in FIG. 3, the air discharge pipe 5b has a larger diameter than the air feed pipe 5a. This is because the air discharge pipe 5b also serves to transport the foreign substances. As shown in FIG. 4, a nozzle face 5c is closest to a surface of the substrate 10.

As shown in FIG. 4, the nozzle face 5a is centrally formed with a plurality of air outlet orifices 5d. The nozzle face is also formed with a plurality of air inlet orifices 5e around the air outlet orifices 5d.

Thus, the foreign substances blown away by the air ejected from the air outlet orifices 5d are immediately sucked into the air inlet orifices 5e, as indicated by arrows in FIG. 3, and are finally discarded.

The cleaning nozzle 5 moves up and down as indicated by an arrow B in FIG. 3. Indicated at 51 is the cleaning nozzle that stops at an upper position. The cleaning nozzle 5 is normally lowered to a proper position (e.g., 2 mm above the substrate) above the substrate 10. When the substrate 10 is moved or replaced, the cleaning nozzle is moved up. As indicated by an arrow C in FIG. 3, the cleaning nozzle 5 performs an operation of removing the foreign substances as moved in a width direction of the substrate 10. Indicated at 52 is the cleaning nozzle moved in the width direction.

In this embodiment, the rectangular cleaning nozzle 5 is moved in a direction perpendicular to a moving direction of the substrate 10, while the rectangular cleaning nozzle 5 orients the long side thereof in the same direction as the moving direction of the substrate.

In this embodiment, the width of the nozzle face 5c of the cleaning nozzle 5 is set to a required value according to a cleaning process time (required throughput). This provides for the setting of a desired amount of movement of the cleaning nozzle 5 according to the width of the substrate 10. Therefore, the cleaning according to the embodiment can deal with the substrates having various widths. In addition, the cleaning according to the embodiment can be carried out under an optimum cleaning condition that an optimum distance is maintained between the substrate 10 and the cleaning nozzle 5 while preventing failure caused by contact between the substrate being transported and the nozzle.

According to the embodiment, the nozzle face 5c of the cleaning nozzle 5 has the rectangular shape thereby providing an increased width for foreign substance cleaning and hence, cleaning efficiency can be notably increased through cleaning time reduction.

Second Embodiment

Figure 5:
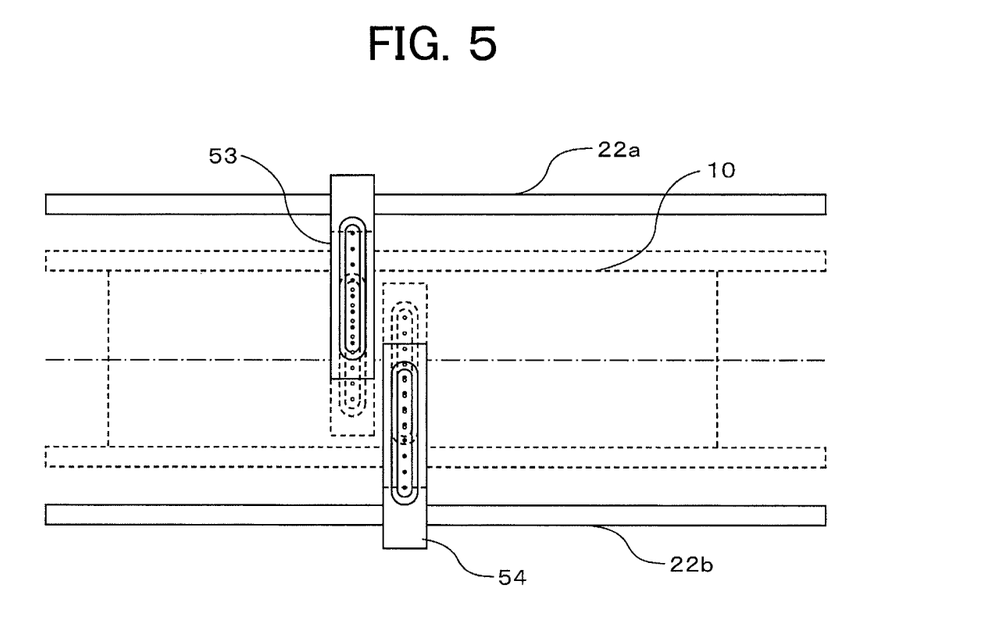
FIG. 5 is a schematic diagram showing a structure of a cleaning nozzle according to a second embodiment of the invention.

FIG. 5 is a diagram showing an exemplary cleaning nozzle layout according to a second embodiment of the invention.

Referring to FIG. 5, two cleaning nozzles 53, 54 are arranged in parallel in the direction perpendicular to the moving direction of the substrate 10. In this embodiment, the cleaning nozzles 53, 54 are supported by the substrate guides 22a, 22b. The two cleaning nozzles 53, 54 have the long sides directed in the direction perpendicular to the moving direction of the substrate. Furthermore, the two cleaning nozzles 53, 54 are adapted to operate in the direction of the long side.

According to the embodiment, cleaning in X-direction and cleaning in Y-direction shown in FIG. 1 are simultaneously accomplished by moving the substrate 10.

Third Embodiment

Figure 6:
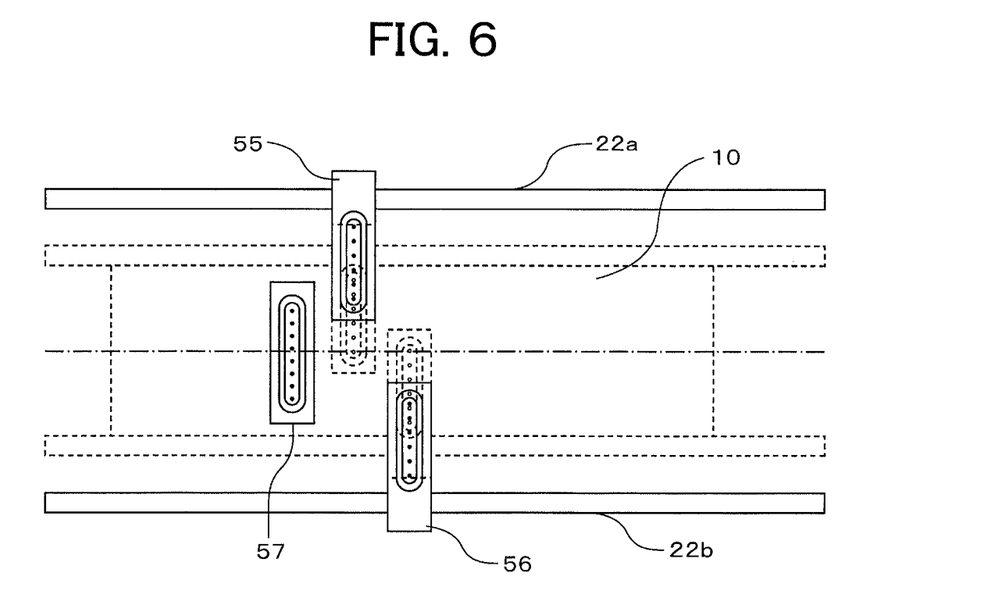
FIG. 6 is a schematic diagram showing a structure of a cleaning nozzle according to a third embodiment of the invention.

FIG. 6 is a diagram showing an exemplary cleaning nozzle layout according to a third embodiment of the invention.

Referring to FIG. 6, three cleaning nozzles 55, 56, 57 according to the embodiment are arranged in parallel in the direction perpendicular to the moving direction of the substrate 10 and in staggered relation. Similarly to the second embodiment, the three cleaning nozzles 55, 56, 57 have the long sides oriented in the direction perpendicular to the moving direction of the substrate. The central cleaning nozzle 57 is fixed to place while the cleaning nozzles 55, 56 on either side are adapted to operate in the direction of the long sides thereof just as in the second embodiment.

Thus, the embodiment permits the cleaning nozzle 57, which is not provided with an operating mechanism, to follow the operations of the cleaning nozzles 55, 56 with respect to the width of the substrate, also offering cost advantage. Further, the substrate 10 is subjected to the cleaning while passed under the cleaning nozzles 55, 56, 57. Therefore, the cleaning process time cannot be a causal factor of lowering the throughput.

Fourth Embodiment

Figure 7:
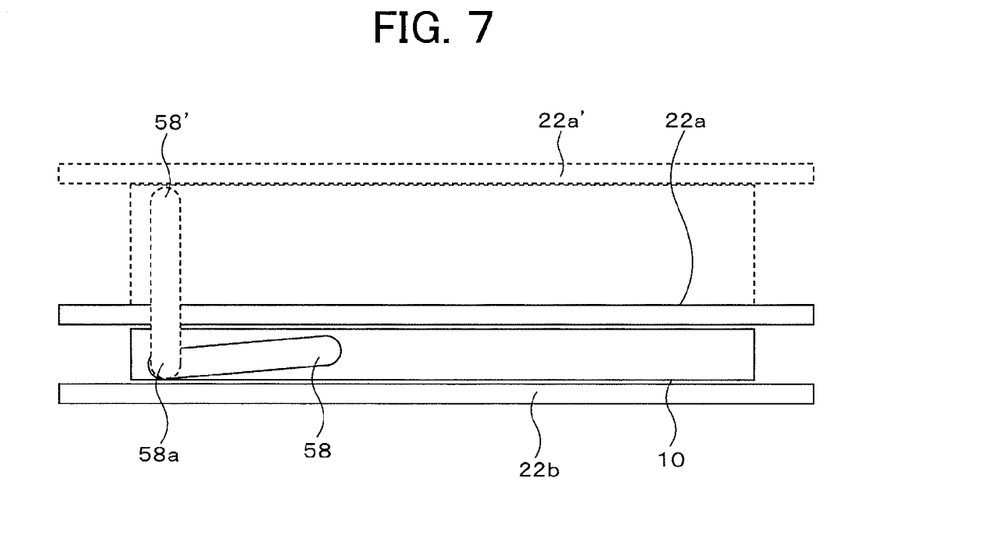
FIG. 7 is a schematic diagram showing a structure of a cleaning nozzle according to a fourth embodiment of the invention.

FIG. 7 is a diagram showing an exemplary cleaning nozzle layout according to a fourth embodiment of the invention.

Referring to FIG. 7, a cleaning nozzle 58 of this embodiment is adapted to rotate about a fulcrum 58a just like an automotive wiper to be positioned as a cleaning nozzle 58' as indicated by a dotted line in the figure.

According to the embodiment, the cleaning nozzle 58 having a longitudinal length to cover the width of the substrate 10 can be rotated in a θ direction from a parallel (horizontal) position to a perpendicular position relative to the substrate 10. Therefore, the cleaning nozzle can deal with substrates having various widths. Further, the cleaning nozzle 58 of the embodiment is adapted for the change of the substrate width simply by mounting a rotation mechanism thereto. Hence, the cleaning device per se can achieve size reduction. This also leads to cost reduction.

Fifth Embodiment

Figure 8:
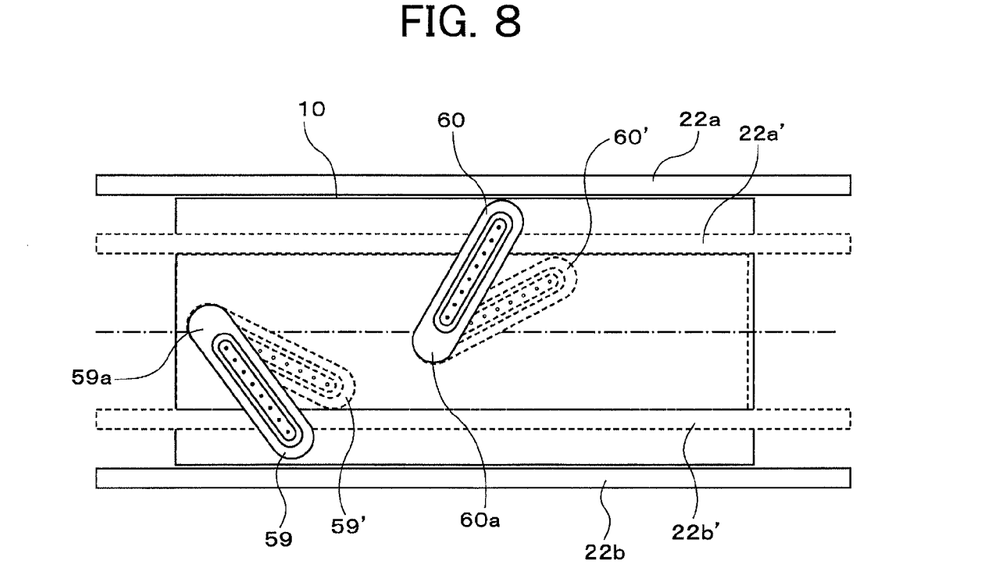
FIG. 8 is a schematic diagram showing a structure of a cleaning nozzle according to a fifth embodiment of the invention.

FIG. 8 is a diagram showing an exemplary cleaning nozzle layout according to a fifth embodiment of the invention.

Referring to FIG. 8, the embodiment has an arrangement wherein cleaning nozzles 59, 60 rotatable about respective fulcrums 59a, 60a just as in the fourth embodiment are provided in two stages. Indicated at 59' and 60' are cleaning nozzles rotated to respective positions. The substrate guides are movable to places, as indicated by 22a' and 22b', according to the width of the substrate.

The embodiment is adapted not only to operate the both cleaning nozzles to deal with the substrate having a large width but also to operate only either the cleaning nozzle 59 or the cleaning nozzle 60 depending upon the width of the delivered substrate.

Namely, the cleaning nozzles of this embodiment are flexible to operate with freedom from restriction by the width of the substrate, so as to accomplish any cleaning jobs regardless of the substrate width.

Sixth Embodiment

According to the embodiment, illustration of which is omitted, the cleaning nozzle is adapted to apply pulsed air in order to further enhance the foreign substance removing effect of the cleaning nozzles of the first to sixth embodiments described above.

According to the embodiment, the foreign substances firmly adhered to the substrate surface can be forcibly removed by dynamically and periodically repeating air blasting and air sucking. The embodiment can achieve improvement in foreign substance removal ability.

The following modifications may be made to the first to sixth embodiments.

A distance sensor may be mounted to a tip of the cleaning nozzle 5 for the purpose of protecting the substrate and the dies 4 previously bonded thereto for lamination. A distance to the substrate or the surface of the laminated dies can be measured by means of the distance sensor and hence, determination can be made as to whether the cleaning nozzle is deviated from a proper distance or not. Measure for creating an alarm in response to the deviation from the proper distance may also be provided. Alternatively, an interlock function may be provided such as to deactivate the die bonder in response to the deviation from the proper distance. There may also be provided a control function that responds to the distance sensor to control the cleaning nozzle 5 to maintain the proper distance from the substrate or the surface of the laminated dies.

This system can prevent the substrate or substrate product carrying the dies from suffering failure caused by contact with the nozzle and can also ensure the proper foreign substance removal ability even if the substrate is deformed or the substrate or the nozzle is displaced due to physical effect.

In order to stabilize the foreign substance removal ability and to obviate failure resulting from decrease in the foreign substance removal ability, a flow sensor or pressure sensor may also be employed for detecting a flow rate of air from the cleaning nozzle 5 and a suction flow rate of air into the inlet orifices. An alarm is created in response to deviation from a proper flow rate. Alternatively, an interlock function may be provided such as to deactivate the die bonder in response to the deviation from the proper flow rate. There may also be provided a function to maintain a constant flow rate by detecting the flow rate by means of the flow sensor or pressure sensor.

This system can prevent the decrease in the foreign substance removal ability which results from abnormal air flow rate or suction flow rate, or can prevent the substrate or substrate product carrying the dies from being damaged due to excessive flow rate. Furthermore, the system can also maintain the proper foreign substance removal ability.

While the invention has been described with reference to the specific embodiments thereof, it is to be understood from the above description that equivalents, changes and modifications will be apparent to those skilled in the art. Therefore, unless otherwise such equivalents, changes and modifications depart from the scope of the present invention, they should be construed as being included therein.

What is claimed is:

1. A die bonder comprising:
   conveying means for conveying a substrate along a transport path;
   a coating unit for applying an adhesive to the substrate while the substrate is conveyed along the transport path;
   a bonding means for bonding a substrate die picked from the wafer to a part coated with the adhesive; and
   a foreign substance removing device for removing foreign matter on the substrate provided upstream of the coating unit;

wherein the foreign substance removing device comprises a cleaning nozzle integrating an air outlet orifice and an air inlet orifice, and a moving means for moving the cleaning nozzle at a distance from the substrate according to the size of the substrate in a direction perpendicular to a direction in which the substrate is conveyed; and wherein a width of the transport path is variable, the cleaning nozzle is one of two cleaning nozzles arranged, one behind the other, so as to extend in respective perpendicular directions toward the center from at least one side of the transport path, and the moving means moves at least one of the two cleaning nozzles.

2. A die bonder comprising:

conveying means for conveying a substrate along a transport path;

a coating unit for applying an adhesive to the substrate while the substrate is conveyed along the transport path;

a bonding means for bonding a substrate die picked from the wafer to a part coated with the adhesive; and a foreign substance removing device for removing foreign matter on the substrate provided upstream of the coating unit;

wherein the foreign substance removing device comprises a cleaning nozzle integrating an air outlet orifice and an air inlet orifice, and a moving means for moving the cleaning nozzle at a distance from the substrate according to the size of the substrate in a direction perpendicular to a direction in which the substrate is conveyed;

wherein the air inlet orifice is provided so as to surround the air outlet orifice;

wherein the air outlet orifice is one of a plurality of air outlet orifices, and wherein the cleaning nozzle is provided with the plurality of air outlet orifices in a row; and wherein a width of the transport path is variable, the cleaning nozzle is one of two cleaning nozzles arranged, one behind the other, so as to extend in respective perpendicular directions toward the center from at least one side of the transport path, and the moving means moves at least one of the two cleaning nozzles.

3. The die bonder according to claim 1, further comprising a fixed cleaning nozzle that has an air outlet orifice and an air inlet orifice in the same manner as the cleaning nozzle, extends on a perpendicular direction, and is fixed above a central portion of the transport path and before or after the cleaning nozzle that is moved by the moving means in the direction in which the substrate is conveyed.

4. The die bonder according to claim 2, further comprising a fixed cleaning nozzle that has an air outlet orifice and an air inlet orifice in the same manner as the cleaning nozzle, extends on a perpendicular direction, and is fixed above a central portion of the transport path and before or after the cleaning nozzle that is moved by the moving means in the direction in which the substrate is conveyed.

* * * * *